United States Patent [19]

Barre

[11] Patent Number: 4,506,363
[45] Date of Patent: Mar. 19, 1985

[54] PROGRAMMABLE LOGIC ARRAY IN ECL TECHNOLOGY

[75] Inventor: Claude Barre, Munich, Fed. Rep. of Germany

[73] Assignee: Siemens Aktiengesellschaft, Berlin & Munich, Fed. Rep. of Germany

[21] Appl. No.: 488,442

[22] Filed: Apr. 25, 1983

[30] Foreign Application Priority Data

May 28, 1982 [DE] Fed. Rep. of Germany ....... 3220302

[51] Int. Cl.³ ............................................ G01R 31/28
[52] U.S. Cl. ..................................... 371/15; 324/73 R
[58] Field of Search ............................. 371/15, 21, 25; 324/73 R, 73 AT

[56] References Cited

U.S. PATENT DOCUMENTS

| | | | |
|---|---|---|---|
| 3,958,110 | 5/1976 | Hong et al. ............................ | 371/15 |
| 4,225,957 | 9/1980 | Doty, Jr. et al. ...................... | 371/15 |
| 4,380,811 | 4/1983 | Gotze et al. ....................... | 371/20 X |
| 4,410,987 | 10/1983 | Ptasinski et al. ....................... | 371/25 |
| 4,418,410 | 11/1983 | Goetze et al. ........................... | 371/15 |
| 4,429,388 | 1/1984 | Fukushima et al. .................. | 371/21 |
| 4,435,805 | 3/1984 | Hsieh et al. ........................... | 371/25 |
| 4,461,000 | 7/1984 | Young .................................. | 371/21 |

OTHER PUBLICATIONS

Kazmi, S., "Design Prototypes Quickly with Programmable Arrays", Electronic Design, Feb. 19, 1981, pp. 121–124.

Patent Abstracts of Japan, (54-56155 Appl. No.), 55-147833, Nov. 18, 1980.

Primary Examiner—Charles E. Atkinson
Attorney, Agent, or Firm—Hill, Van Santen, Steadman & Simpson

[57] ABSTRACT

A programmable logic array, constructed in emitter coupled logic technology, may be tested in its non-programmed condition. Diodes are located between all product terminal lines and first test terminals on the semiconductor chip as they are disposed between all sum term lines and a second test terminal. Furthermore, each input line of the sum matrix is respectively connected by way of a diode to the inverting output of a respective different input amplifier. When the sum matrix exhibits more input lines than there are input amplifiers, the connection is repeated cyclically. In this case, the sum matrix is divided into sub-matrices whose mutually corresponding sum term lines are linked by way of logic elements.

3 Claims, 3 Drawing Figures

PROGRAMMABLE LOGIC ARRAY IN ECL TECHNOLOGY

BACKGROUND OF THE INVENTION

1. Field of the Invention

The present invention relates to a programmable logic array, and is more particularly concerned with a programmable logic array constructed in ECL technology having a product matrix wherein all input lines for true and inverted matrix control signals, connected to the outputs of input amplifiers, are linked to all product term lines by non-inverting coupling elements connected over disconnectible connections and all product term lines are connected to the inputs of product term converters, and having a sum matrix wherein the outputs of the product term inverters are connected to the input lines of the sum matrix and the input lines are linked to all sum term lines by non-inverting coupling elements connected over disconnectible connections, and all sum term lines are connected to the inputs of inverting output amplifiers whose outputs form the outputs of the logic array.

2. Description of the Prior Art

Programmable logic arrays (PLA) are known in a multitude of integrated embodiments in terms of their general logical design and the selection of the logic elements (cf. "Electronic Design", 29 (1981), No. 4, pp. 12-124). Each programmable logic array contains two matrices. By way of non-inverting and inverting amplifiers, the input variables control the potentials of the input lines of the AND or, respectively, product matrix present in pairs. In the final condition of the logic array, coupling elements with whose assistance logic operations of non-inverted and/or inverted input signals are executed are effective at intersections of the input lines with product term lines selected in accordance with the programming of the logic array.

The product term lines form, if necessary given interposition of inverters, the input lines of the OR or, respectively, sum matrix. Here, also, coupling elements which need not necessarily be identical to the coupling elements in the product matrix are effective at intersections of the input line with the sum term lines selected in accordance with a programming rule. Non-inverting or inverting amplifiers are generally connected to the sum term-lines, the logic results of the programmable logic array being available at the outputs of such amplifiers.

In the manufacture of programmable logic arrays, coupling elements are generally disposed at all occurring intersections in both matrices and are connected to the intersecting matrix lines over disconnectible connections (fusible links). Only when a specific use is determined, i.e. the desired logic operation functions concerning all outputs are known, is a portion of the coupling elements suppressed by the "programming" at the manufacturer or the user by destroying the disconnectible terminal connections. Likewise, errors which already existed in the unprogrammed array can only now be perceived by checking the logical functions.

Although the use of programmable logic arrays excellently offers the possibility, within limits, of realizing arbitrary logic operations without special matching of the integration masks to the respective requirements, one should not overlook that the programming operation still represents a relatively involved step proceeding to the final fabrication of the logic array. Therefore, it would be desirable to check a programmable logic array before programming. This is opposed, however, by the following provisions:

(a) as internal lines, the outputs of the product matrix are not contactible. The same also frequently applies to outputs of the sum matrix when, in particular, further circuit arrangements follow the programmable logic array within an integrated module;

(b) both the non-inverting and the inverting outputs of all input amplifiers coupled to all product term lines so that changes of the binary values of the input variables do not penetrate to the potentials of the product term lines; and (c) all product term lines are connected to all sum term lines so that individual faulty or not-completely connected coupling elements are not noticeable.

SUMMARY OF THE INVENTION

The object of the present invention, therefore, is to provide a programmable logic array which is constructed on the basis of ECL technology and having a low additional expense such that checking is possible before programming and to specify a method for checking such a programmable logic array.

Such a logic array, according to the present invention, exhibits the features:

(a) the cathodes of diodes are connected to all product term lines, their anodes being connected to a shared product matrix test terminal;

(b) the sum matrix is divided into the smallest possible number of sum sub-matrices with separate sum term lines, whereby each sum sub-matrix may exhibit, at most, as many input lines as there are input amplifiers;

(c) the mutually corresponding sum term lines of a plurality of sum sub-matrices are logically linked by additional logic elements according to the operational functions valid within the sum sub-matrices;

(d) the cathodes of diodes are connected to all sum term lines, their anodes being connected to a shared sum matrix test terminal; and (e) diodes are disposed in the forward conducting direction between the inverting outputs of the input amplifiers and the input lines of the sum matrix or, respectively, of the sum sub-matrices such that all input lines of the sum matrix are covered, given a plurality of sum sub-matrices, by a cyclically repeated involvement of the inverting outputs of the input amplifiers and each input lines is connected over a diode to only one output of an input amplifier.

In testing a programmable logic array of the type set forth immediately above, the test is characterized by the following steps, given continuous measurement of the level applied to the test terminal of the product matrix:

(a) a center level is applied to all inputs of the logic arrangement, the center level lying between the high signal level and the low signal level of the input variable;

(b) the high signal level is individually successively applied to the respective inputs while retaining the center level at the remaining inputs; and (c) the low signal level is successively individually applied to the respective inputs upon retention of the center level at the remaining inputs.

The method is further characterized by the following steps, given continuous measurement of the level applied to the test terminal of the sum matrix:

(a) the high signal level is applied to all inputs of the logic array; and (b) a level, superelevated in comparison to the high signal level by at least three diode threshold voltages, is individually successively applied to the respective inputs upon retention of the high signal level to the remaining inputs.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
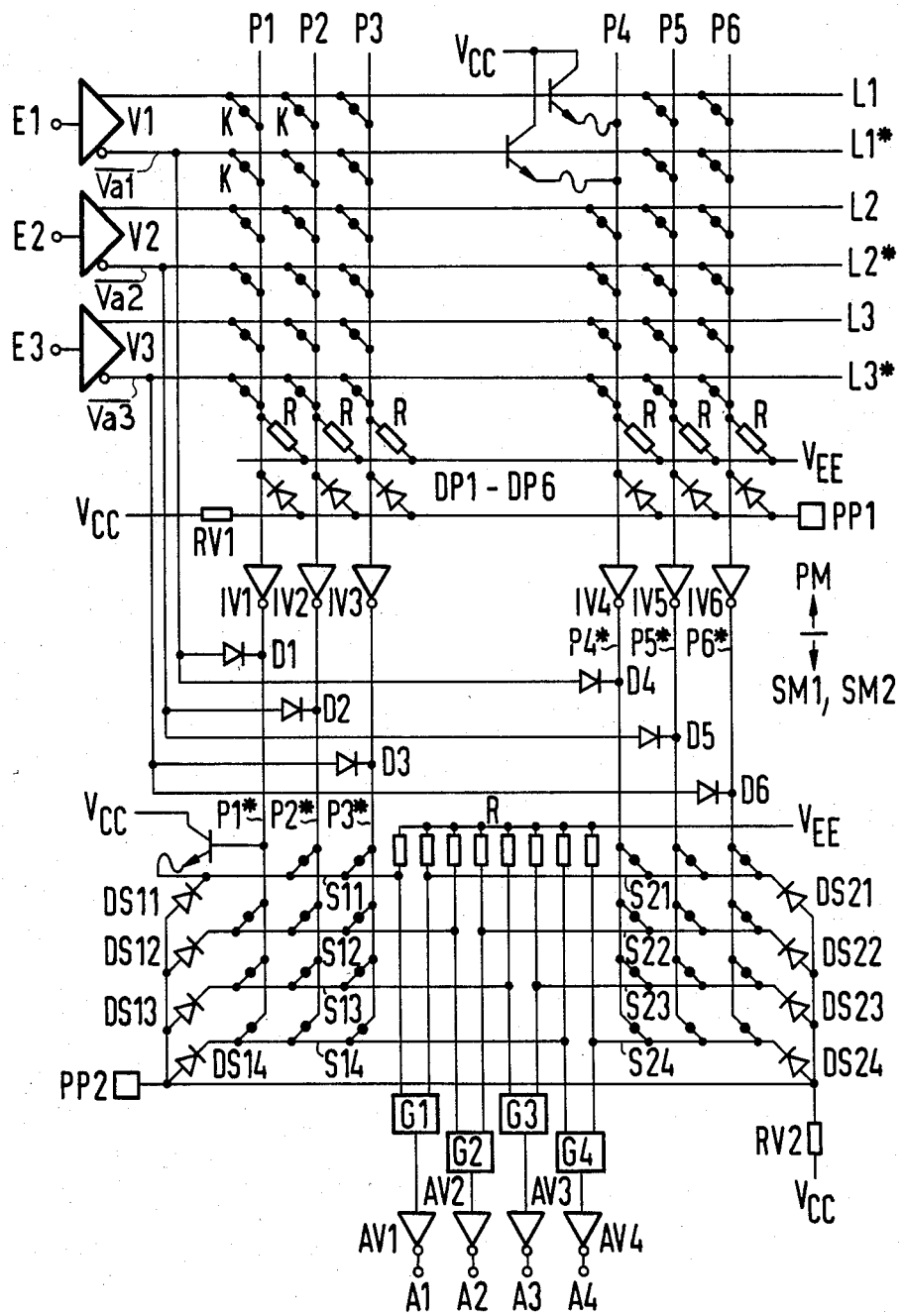
FIG. 1 is a simplified schematic diagram of a programmable logic array constructed in accordance with the present invention.

A programmable logic array is illustrated in FIG. 1 as having three inputs E1–E3 for receiving binary input variables. Three input amplifiers V1–V3, constructed in emitter-coupled logic (ECL) technology, respectively exhibit a non-inverting output and an inverting output. The input lines L1, L1*–L3, L3* of the product matrix PM with six product term lines P1–P6 are connected to the amplifier outputs. The product term lines P1–P6 are terminated in six product term inverters IV1–IV6 whose outputs are connected to input lines P1* through P3* and P4* through P6* for two separate sum sub-matrices SM1 and SM2. The sum sub-matrices SM1 and SM2 contain four respective sum term lines S11–S14 and S21–S24 which are connected in pairs to the inputs of logic elements G1–G4. The outputs of these amplifiers form the outputs A1–A4 of the programmable logic array.

Bipolar transistors, constructed in an emitter follower configuration, are employed in the arrangement according to FIG. 1 as coupling elements K. For the purpose of simplifying the drawing, only the coupling elements at the intersections of the inputs lines L1 and L1* with the product term line P4 in the product matrix PM and the intersection of the input line P1* with the sum term line S11 in the sum sub-matrix SM1 are illustrated in detail in FIG. 1. At all other intersections, the coupling elements K are only symbolically indicated by a point which is connected over diagonal connections to the intersecting lines. All product sum term lines are connected to the emitter side operating voltage $V_{EE}$ by way of resistors R. The resistors R serve as shared emitter resistors for the emitter followers employed as coupling elements and respectively assigned to a line.

Figure 2:
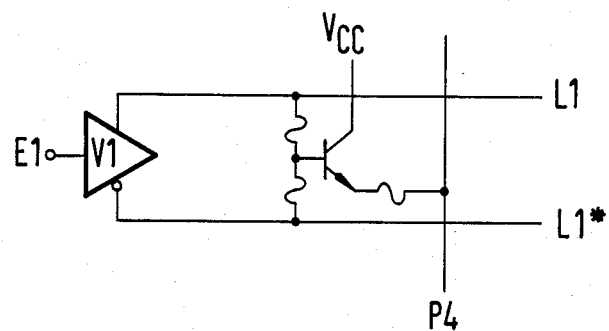
FIG. 2 is a schematic circuit diagram of a variation of the arrangement of the coupling elements of the product matrix.
Figure 3:
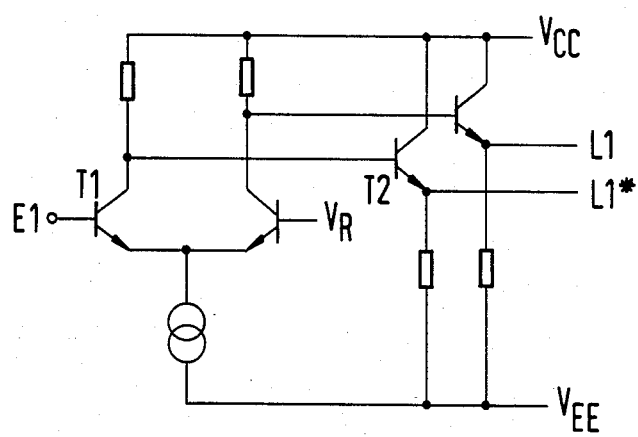
FIG. 3 is a schematic circuit diagram of an input amplifier for use in practicing the present invention.

Since, given a completely programmed logic array, at most one further intersection is equipped with an effective coupling element at the two intersections of a product term line, for example the line P1, with the input lines, for example L1 and L1* carrying the mutually inverse control signals in the product matrix, the two emitter followers to be seen in FIG. 1 can be replaced by a circuit arrangement according to FIG. 2 and having only one emitter follower. The consequence is that, in the unprogrammed condition, the non-inverting output and the inverting output of the input amplifiers V1–V3 are galvanically connected. The short of the amplifier outputs, however, is also harmless when the unprogrammed logic array is placed in operation. This can be seen without further consideration from FIG. 3 which illustrates an input amplifier of a known type constructed in ECL technology. The higher output level supplied by the one transistor takes effect and the other transistor is inhibited.

In addition to the devices described up to now, the arrangement according to FIG. 1 also contains a few further devices which are treated in greater detail below. In addition to the aforementioned division of the sum-matrix, they also serve to adapt the programmable logic array for checking.

A plurality of diodes DP1–DP6 are connected between a test line extending from a test terminal PP1 and all product term lines P1–P6 in such a manner that their anodes are connected to the test line. A resistor RV1 is connected to the collector operating voltage terminal $V_{CC}$ and to the test line and produces a slight bias current for the diodes DP1–DP6. Since the resistor RV1 is only required during testing, it need not be integrated on the module chip.

A plurality of diodes DS11–DS14 are provided in the same manner between a second test terminal PP2 and all sum term lines S11–S24. The same also applies to the appertaining dropping resistor RV2 as applies for the dropping resistor RV1.

For purposes of testing the product matrix, a level M ($-1.2V$) is first applied to all variable inputs E1–E3, the level M lying in the center between the normal binary signal levels H ($-0.8V$) and L ($-1.6V$). A level corresponding to a center level M can then be measured at the test terminal PP1. The high binary level H is now successively applied to respective variable inputs. The higher level likewise occurs at the test terminal PP1, but only when the coupling elements connected to the non-inverting amplifier outputs and their terminal connections are in proper order. Given an arrangement of the coupling elements according to FIG. 1, the coupling elements connected to the inverting outputs of the amplifiers are checked in a second pass wherein the low binary signal level L is successively applied to the inputs E1–E3. The level applied to the test terminal PP1 is likewise high when the matrix is free of errors.

Given a design of the product matrix according to FIG. 2, the second pass would be superfluous regarding the check of the coupling elements. However, it is recommended to carry out the same since some of the individual separable connections which first bridge the two amplifier outputs could be interrupted.

Since the test of the sum matrix is only possible analogous to the test of the product matrix when the levels on the input lines are individually controllable, further diodes D1–D6 are connected to the inverting outputs $\overline{Va1}$–$\overline{Va3}$ of the input amplifiers V1–V3, on the one hand, and, on the other hand, are connected to the input lines P1*–P6* of the sum matrix (FIG. 1). The connection occurs such that the first input line P1* is connected to the first amplifier V1, the second input line P2* is connected to the second amplifier V2, etc., until either all input lines or all amplifiers are covered. When the number of input lines of the sum matrix is greater than the number of variable inputs or, respectively, input amplifiers, then the connection of the input lines to the amplifier outputs repeats cyclically. Since, however, two or more input lines are again affected by a level change at an amplifier output, the aforementioned division of the sum matrix into just as many sub-matrices is provided. Achieved with the galvanic separation of the mutually corresponding, nonetheless, logically re-lined sum term lines of the sum matrices thereby condition is that the error of a coupling element connected to the one input lines is not masked by the faultless operation of a coupling element connected to the other input line driven parallel thereto as would be the case given continuous sum term lines.

For the purpose of testing the sum matrix or, respectively, the sum sub-matrices, a level in the range of the normal binary signal level, preferably a high signal level H, is applied to all inputs E1–E3 of the logic array. A corresponding, comparatively low level can then be measured at the test terminal P2 of the sum matrix. The level at the input of an amplifier is now increased to a value S with, for example, +1.5V, which is not permitted in the normal operation. The transistor T1 (cf. FIG. 3) of this amplifier is driven into the saturation range and the input level S, reduced by the voltage drop at the base-collector diode, penetrates to the base of the transistor T2. Therewith, finally, the level of the test terminal PP2 is also increased. The latter, however, does not apply when one of the coupling elements connected to the input lines having an increased level exhibits an error. The level S is successively applied to all variable inputs E1–E3.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a programmable logic array of the type which includes a product matrix and a sum matrix, in which a plurality of input amplifiers each include an input for receiving binary input signals and inverting and non-inverting outputs connected to respective product matrix input lines, in which a plurality of product term lines intersect the product matrix input lines and are coupled thereto by non-inverting coupling elements over programmable disconnectible connections and are terminated by respective product term inverters, in which a plurality of sum matrix input lines are respectively connected to the outputs of the product term inverters in which a plurality of sum term lines intersect the sum matrix input lines and are coupled thereto by non-inverting elements over programmable disconnectible connections and are connected to respective output amplifiers of the programmable logic array, the improvement therein comprising:
    a first test terminal for receiving a predetermined test potential;
    a plurality of first diodes each including an anode connected to said first test terminal and a cathode connected to a respective product term line;
    said sum matrix divided into submatrices each including divided sum term line sections, corresponding in each sub-matrix, and, at most, as many sum matrix input lines as there are input amplifiers;
    a plurality of logic circuits each including an output connected to the input of a respective output amplifier and a plurality of inputs connected to corresponding sum term line sections;
    a plurality of second diodes each including an anode connected to the inverting output of a respective input amplifier and a cathode connected to a respective sum input line such that each of the sum matrix input lines is so connected and is also connected to only one respective input amplifier;
    a second test terminal for receiving a predetermined test potential; and
    a plurality of third diodes each including a cathode connected to a respective sum term line section and an anode connected to said second test terminal.

2. A method of testing a programmable logic array of the type which includes a product matrix and a sum matrix, in which a plurality of input amplifiers each include an input for receiving binary input signals and inverting and non-inverting outputs connected to respective product matrix input lines, in which a plurality of product term lines intersect the product matrix input lines and are coupled thereto by non-inverting coupling elements over programmable disconnectible connections and are terminated by respective product term inverters, in which a plurality of sum matrix input lines are respectively connected to the outputs of the product term inverters, in which a plurality of sum term lines intersect the sum matrix input lines and are coupled thereto by non-inverting elements over programmable disconnectible connections and are connected to respective output amplifiers of the programmable logic array, in which there is a first test terminal for receiving a predetermined test potential, a plurality of first diodes each including an anode connected to said first test terminal and a cathode connected to a respective product term line, the sum matrix divided into sub-matrices each including divided sum term line sections, corresponding in each sub-matrix and, at most, as many sum matrix input lines as there are input amplifiers, a plurality of logic circuits each including an output connected to the input of a respective output amplifier and a plurality of inputs connected corresponding sum term line sections, a plurality of second diodes each including an anode connected to the inverting output of a respective input amplifier and a cathode connected to a respective sum input line such that each of the sum matrix input lines is so connected and is also connected to only one respective input amplifier, a second test terminal for receiving a predetermined test potential; and a plurality of third diodes each including a cathode connected to a respective sum term line section and an anode connected to the second test terminal, comprising the steps of:
    applying a continuous predetermined potential to the first test terminal;
    applying a center voltage level lying between the input binary levels, to all inputs of the input amplifiers;
    applying the high binary level to the inputs of the input amplifiers successively and individually while maintaining the center voltage level at the remaining inputs of the input amplifiers; and
    applying the low binary level to the inputs of the input amplifiers successively and individually while maintaining the center voltage level on the remaining inputs of the input amplifiers.

3. A method of testing a programmable logic array of the type which includes a product matrix and a sum matrix, in which a plurality of input amplifiers each include an input for receiving binary input signals and inverting and non-inverting outputs connected to respective product matrix input lines, in which a plurality of product term lines intersect the product matrix input lines and are coupled thereto by non-inverting coupling elements over programmable disconnectible connections and are terminated by respective product term inverters, in which a plurality of sum matrix input lines are respectively connected to the outputs of the product term inverters, in which a plurality of sum term lines intersect the sum matrix input lines and are coupled thereto by non-inverting elements over programmable disconnectible connections and are connected to respective output amplifiers of the programmable logic array in which there is a first test terminal for receiving a predetermined test potential, a plurality of first diodes each including an anode connected to said first test terminal and a cathode connected to a respective product term line, the sum matrix divided into submatrices each including divided sum term line sections, corresponding in each sub-matrix and, at most, as many sum matrix input lines as there are input amplifiers, a plurality of logic circuits each including an output connected to the input of a respective output amplifier and a plurality of inputs connected corresponding sum term line sections, a plurality of second diodes each including an anode connected to the inverting output of a respective input amplifier and a cathode connected to a respective sum input line such that each of the sum matrix input lines is so connected and is also connected to only one respective input amplifier, a second test terminal for receiving a predetermined test potential, and a plurality of third diodes each including a cathode connected to a respective sum term line section and an anode connected to the second test terminal, comprising the steps of:

applying a continuous predetermined potential to the second test terminal;

applying the high binary level to all of the inputs of the input amplifiers; and applying a superelevated high level, equal to at least three times the threshold value of a diode, successively and individually to the inputs of the input amplifiers while maintaining the high binary level at the remaining inputs.

* * * * *